Figure 1:
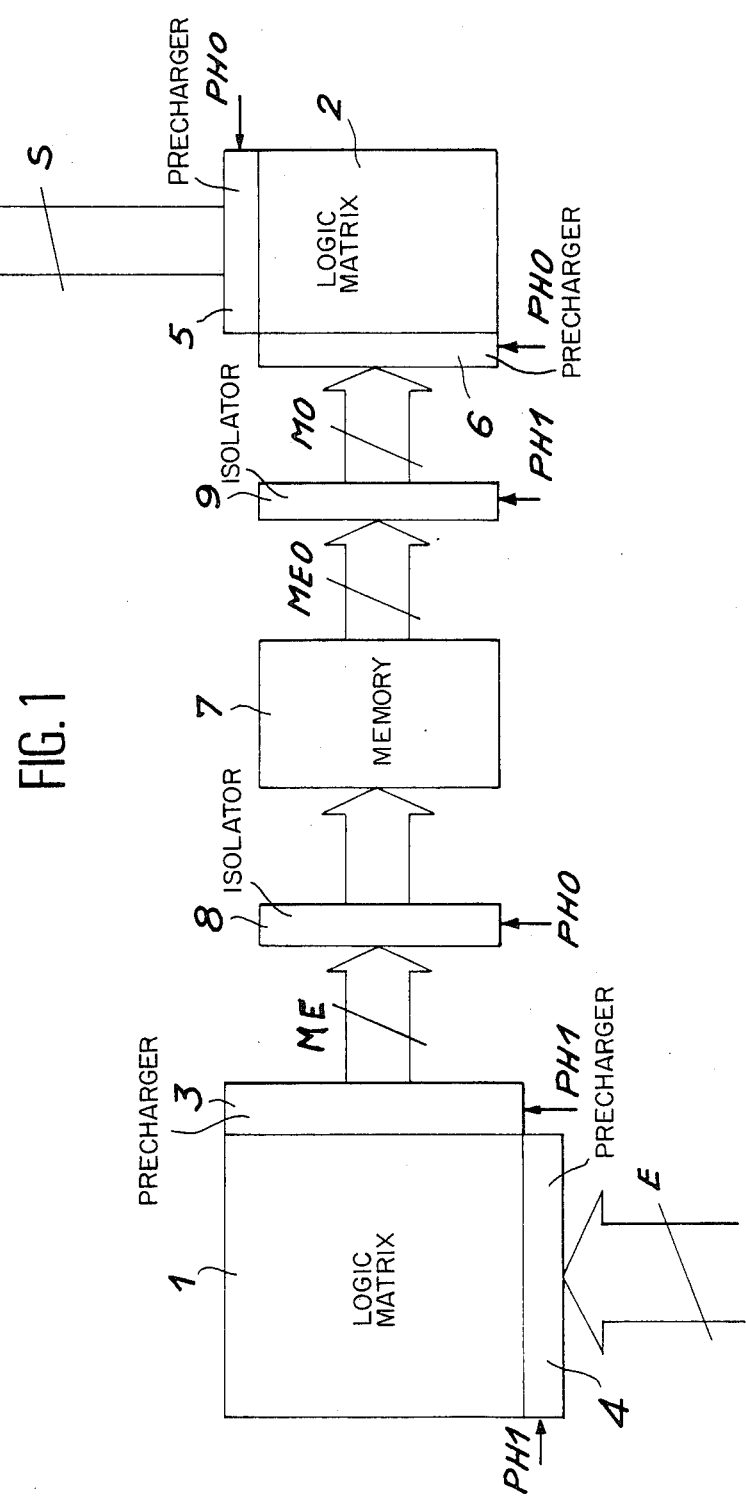

United States Patent [19]
Anceau

[11] Patent Number: 4,812,685
[45] Date of Patent: Mar. 14, 1989

[54] DYNAMIC LOGIC ARRAY WITH ISOLATION AND LATCHING MEANS BETWEEN PLANES

[75] Inventor: Francois Anceau, Plaisir, France

[73] Assignee: Bull, S.A., Paris, France

[21] Appl. No.: 154,340

[22] Filed: Feb. 10, 1988

[30] Foreign Application Priority Data

Feb. 12, 1987 [FR] France ................. 87 01741

[51] Int. Cl.$^4$ ................. H03K 19/177; H03K 19/096
[52] U.S. Cl. ................. 307/481; 307/452; 307/465; 307/469; 340/825.91
[58] Field of Search ............. 307/448, 465, 451–453, 307/468–469, 473, 480, 481, 269; 364/216; 340/825.83, 825.87, 825.91

[56] References Cited

U.S. PATENT DOCUMENTS

| | | | |
|---|---|---|---|
| 4,577,190 | 3/1986 | Law | 340/825.91 X |
| 4,611,133 | 9/1986 | Peterson et al. | 307/465 |
| 4,661,728 | 4/1987 | Kashimura | 307/452 X |
| 4,661,922 | 4/1987 | Thierbach | 307/465 X |
| 4,740,721 | 4/1988 | Chung et al. | 364/716 X |
| 4,760,290 | 7/1988 | Martinez | 307/465 |
| 4,769,562 | 9/1988 | Ghisio | 307/465 X |

FOREIGN PATENT DOCUMENTS 0011651 1/1979 Japan ................. 307/469

Primary Examiner—David Hudspeth

[57] ABSTRACT

A dynamic logic array circuit can operate in two clock phases. It includes two matrices (1, 2) comprising dynamic logical gates, which require a precharging phase that precedes a functional phase. The array also includes memorizing means (7), the inputs of which are connected to the outputs of the first matrix (1) via first controlled isolating means (8), the outputs (MEO) of the memorizing means being connected to the inputs of the second matrix (2) via second controlled isolating means (9), the first isolating means (8) being controlled for authorizing the transfer of the signals emitted by the first matrix (1) to the memorizing means (7) during the precharging phase (PHO) of the second matrix (2) and the second isolating means (9) being controlled for authorizing the transfer of the data contained in the memorizing means (7) to the second matrix (2) during the precharging phase (PH1) of the first matrix (1). The invention is particularly applicable to CMOS technology. It can be used to make programmable or programmed logic arrays used in particular in computer control units.

12 Claims, 3 Drawing Sheets

DYNAMIC LOGIC ARRAY WITH ISOLATION AND LATCHING MEANS BETWEEN PLANES

The present invention relates to logical networks, also referred to as logic arrays, furnishing at least one output signal representing a logical function of a plurality of logical input variables.

Logic arrays can be designed at the time of manufacture with a view to directly attaining predetermined logical functions. They can also be manufactured in a predefined manner so that they can be programmed by the customer.

The present invention is applicable to both these kinds of logical network, that is, both programmed and programmable.

Any logical function can always be represented as the logical sum of logical products of certain input variables or their complement. The logical function is then in a disjunctive form, and each product of the sum is known as a minterm.

A logical function can also be represented in a conjunctive form, which is the dual of the disjunctive form. The logical function then appears as the product of logical sums of certain input variables or their complement. These logical sums are known as maxterms.

Thus the programmed or programmable logical arrays comprise two matrices, each matrix being made up of a plurality of logical gates of a given type.

The input logical variables are applied directly, or via an inverter, to the input of the logical gates of the first matrix.

The output signals of this matrix represent the logical values of the monomials (minterms or maxterms) that occur to define the logical functions.

Certain output signals of the first matrix are then applied to the inputs of the logical gates of the second matrix, and the signals present at the outputs of this second matrix represent the logical values that assume the various logical functions for given values of the logical input variables.

Thus logic arrays can for example comprise a first matrix including a plurality of AND gates having a plurality of inputs and a second matrix of OR logical gates having a plurality of inputs connected to certain outputs of the AND logical gates of the first matrix. The disjunctive form is then used.

If the conjunctive form is used, then the first matrix will comprise OR gates, while the second matrix is made up of AND gates.

Another possibility that is preferable to the above comprises making a logic array by means of two matrices comprising NOR logical gates, or two matrices comprising NAND logical gates.

In the simplest case, the logical gates used for making these matrices are of the static type, which permits very fast functioning of the logic array. However, static logical gates do not permit very large-scale integration, and they consume considerable static power.

To overcome these disadvantages, it is preferable to use dynamic logical gates, which operate in two phases: a precharging phase and a functional phase. This is true, in particular, for logical gate matrices of the type known as CMOS, which use N-channel or P-channel (NMOS or PMOS) field effect transistors. It is then possible to make networks or arrays of NOR gates with very large-scale integration. In positive logic, these gates are attained with the aid of NMOS transistors the source of which is connected to ground and the drain of which is connected to the output line of the gate. By reversing the input signals, these gates become AND gates.

It is also possible to make arrays of NAND gates by using PMOS transistors. However, this latter kind of transistor is bulkier than NMOS transistors and does not permit integration on as large a scale.

Nevertheless, the disadvantage of dynamic logical gates is that they require a precharging phase for their output line, prior to a functional phase. As a result, CMOS logic arrays also require a plurality of functional phases.

One solution may comprise precharging the output lines of two matrices simultaneously during a first phase (precharging phase); this operation requires isolating the output lines of the first matrix from the input lines of the second matrix.

After this precharging phase, the first matrix is activated by the validation of its input signals. Then the second matrix is made inactive by cancelling the isolation between the two matrices. The precharging phase is then followed by two functional phases. The two functional phases are necessary, because the output voltages of the first matrix must be stabilized prior to being able to be applied to the inputs of the second matrix.

The object of the invention is to attain a dynamic logic network capable of functioning in only two phases, and thus to improve its speed.

To this end, in accordance with the invention, the logic network is designed such that the precharging phase of one of the matrices of the array coincides with the functional phase of the second matrix, and vice versa. To accomplish this, memorizing means are interposed between the outputs of the first matrix and the inputs of the second matrix. The output lines of the first matrix are furthermore connected the memorizing means by way of controllable isolating means. Finally, the memorizing means are connected to the inputs of the second matrix by way of second controllable isolating means.

More precisely, the invention relates to a logic array comprising a first matrix of logical gates the output signals of which are transmitted to the inputs of a second matrix comprising one or more logical gates, in which each logical gate of the matrices is of the dynamic type, that is, operating during a functional phase which is preceded by a precharging phase in which the output lines of the logical gates are charged to a predetermined voltage by precharging means that are made active by a precharging control signal; according to the invention, such an array includes memorizing means the inputs of which are connected to the outputs of the first matrix by way of first controlled isolating means, the outputs of the memorizing means being connected to the inputs of the second matrix b way of second controlled isolating means, and the first isolating means are controlled for authorizing the transfer of the signals emitted by the first matrix to the memorizing means during the precharging phase of the second matrix, while the second isolating means are controlled for authorizing the transfer of the data contained in the memorizing means to the second matrix during the precharging phase of the first matrix.

The invention also proposes an embodiment using matrices comprising NOR gates realized by means of NMOS field effect transistors. This embodiment will be described in further detail below.

Figure 2:
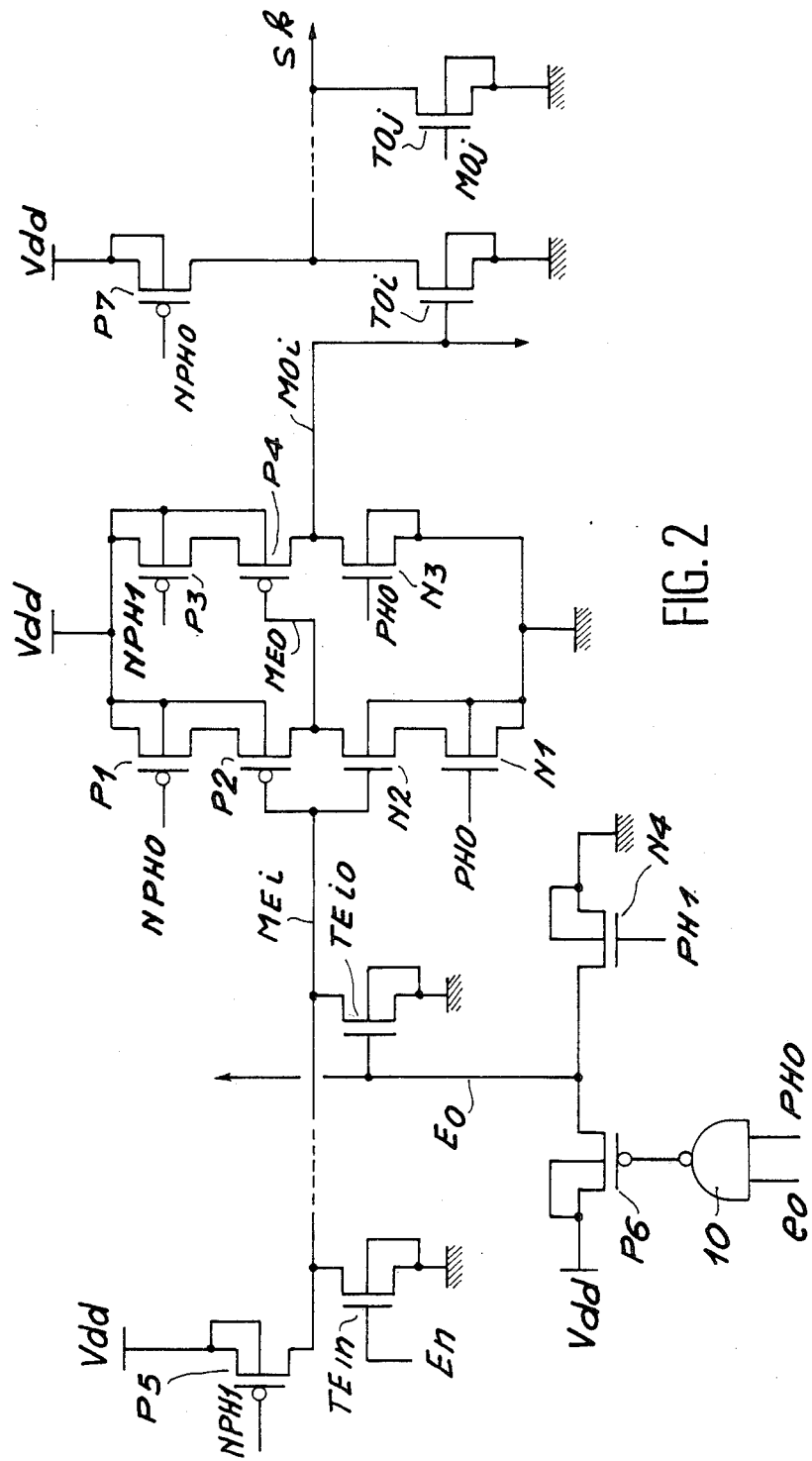
Figure 3:
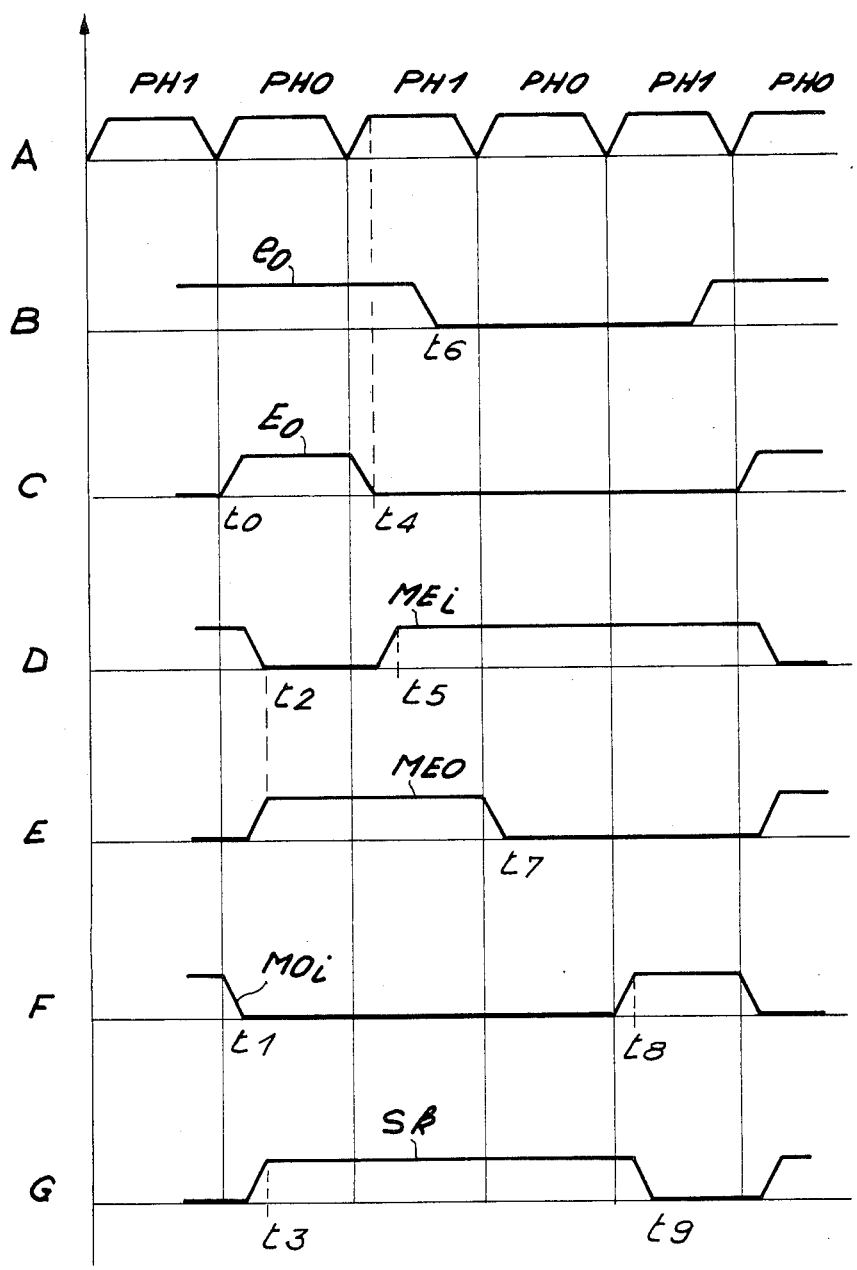

FIG. 1. is a schematic representation of an entire logic array according to the invention;

FIG. 2 illustrates an embodiment of the logic array according to the invention; and FIG. 3 shows timing diagrams of the principal signals occurring in the circuit of FIG. 2.

FIG. 1 very generally illustrates a logic array of the dynamic type according to the invention. In the classical manner, it includes a first matrix 1, which receives variables E, and a second matrix 2, which at its output furnishes one or more signals S representing one or more logical functions of the input variables E.

These input variables E are signals representing independent logical variables, as well as their complements.

The two matrices 1, 2 comprise a plurality of logical gates, which can be AND, OR, NOR, and/or NAND gates. The type of logical gates used in each of the matrices can naturally be selected in accordance with the logical functions desired. Moreover, these logical gates are of the dynamic type and must operate in two phases: a first phase for precharging their output lines, which is defined by the signals PHI and PH0 for the first and second matrix, respectively, and a second functional phase, defined by PH0 and PHI for the first and second matrix, respectively.

Regardless of the intended version used to attain the two matrices 1, 2, means for precharging these matrices must be provided. The means for precharging the first matrix comprise precharging circuits 3 that connect the output lines ME of this matrix with a source of supply voltage. The precharging means also include a circuit 4 for forcing the input lines of the first matrix to a first predetermined voltage. It is understood that these forcing voltages of the inputs are selected as a function of the precharging voltage for the outputs and of the type of logical gate used in the first matrix. For example, if NOR gates are used, made using NMOS transistors, then the output line of these gates is precharged to a positive voltage, for example 5 volts, and all the input lines of the matrix must then be forced to the value of 0 volts. These two circuits 3, 4 of the precharging means are made active by the phase signal PHI, or a signal that is a function of it.

The situation is analagous in the case of AND gates, which are made from NOR gates after inversion of the input signals.

If NAND gates, made with PMOS transistors the source of which is connected to a positive voltage and the drains of which are connected to one another to comprise the output of the gate, then the output will be precharged to 0 volts and the inputs will be forced to a positive voltage.

Similarly, the second matrix 2 is associated with precharging means 5, 6, which comprise a precharging circuit 5 for precharging the output lines of this matrix and the circuit 6 that enables the forcing of these input lines to a suitable voltage. These two circuits 5, 6 are activated by the signal PH0, or a signal that is a function of PH0.

The output lines ME of the first matrix are connected to memorizing means 7 via isolating means 8 controlled by the signal PH0. The isolating means 8 function as switches that close in the presence of the signal PH0. One switch is interposed between each output line of the first matrix and the corresponding input line of the memorizing means 7. These memorizing means 7 comprise as many memorization cells as the matrix I has outputs.

The output lines MEO of the memorizing means 7 are connected to second isolating means 9. These second isolating means have a function analagous to that of the first isolating means 8. They are controlled by the signal PHI, and they close when this signal is present.

The output lines MO of the second isolating means 9 are connected to the input lines of the second matrix 2 via the forcing circuit 6.

The function of the apparatus of FIG. 1 will now be described, assuming that the input signals E are applied during the period PH0 to the first matrix 1. The signals PH0 and PH1 are the two successive phases of a clock signal, not shown.

During phase PH0, the output lines S of the second matrix 2 are precharged to a predetermined voltage by means of the precharging circuit 5. During this same phase, the input lines of the second matrix 2 receive a forcing voltage via the circuit 6. The isolating means 9 also isolate the output of the memorizing means 7 of the circuit 6. Moreover. during the phase PH0, the first isolating means 8 connect the output lines ME of the first matrix 1 with the inputs of the memorizing means 7. Finally, the precharging circuits 3 and 4 are inhibited.

As a result, during this phase PH0 the matrix 1, which has been assumed to be precharged first, is active. The voltages present on these output lines ME of this matrix, which represent the logical values of the monomials (minterms or maxterms) occurring during the definition of the logical functions to be attained, are transmitted to the memorizing means 7, the outputs of which remain isolated.

In the course of the following phase PH1, it is the precharging circuits 3, 4 of the first matrix that are made active, while the first isolating means 8 isolates the memorizing means 7 of the first matrix. On the other hand, the precharging circuits 5 and 6 of the second matrix 2 are inactive. Finally, the second isolating means 9 permit the transfer of the signals stored during the preceding phase in the memorizing means 7 to the inputs of the second matrix 2. Once the circuits of, the second matrix are stabilized, signals representing the logic functions attained by the logical array are present on the output lines S.

At the beginning of the following phase PH0, the first matrix 1 is indeed precharged and can then commence with a new functional phase as described above.

Thus the logic array shown in FIG. 1 does permit functioning in only two clock phases. This is made possible by the presence of the memorizing means 7 and the first and second isolating means 8 and 9, which authorize the coincidence of the functional phase of one of the matrices with the precharging phase of the other matrix, and vice versa.

Turning now to FIG. 2, a particular embodiment of the logic array according to the invention will now be described. In this exemplary embodiment, the two matrices 1 and 2 comprise NMOS field effect transistors connected in such a way as to form NOR gates. For the sake of clarity, only a single logical gate per matrix has been shown.

By convention, PMOS transistors are represented with a small circle drawn on their gate.

On of the NOR gates of the first matrix comprises transistors TEi0 ... TEin having their source connected to ground and their drain connected to one of the output lines MEi of the first matrix. The gates of the transistors receive the signals $E_o \ldots E_n$, respectively, emitted by an associated circuit. Also, for reasons of clarity, only the circuit N4, P6 associated with the first transistor TEi0 is shown in FIG. 2. This circuit includes a first PMOS field effect transistor P6, the source of which is connected to a positive supply voltage Vdd and the drain of which is connected to the drain of an NMOS field effect transistor N4 and to the gate of the transistor TE0. The source of the transistor N4 is connected to ground. At its gate, this transistor N4 receives the signal PH1 defining the second clock phase. The gate of the transistor P6 is connected to the output of a NAND gate 10 having two inputs, the first of its inputs receiving the signal PH0 that defines the first clock phase and its second input receiving the logical variable $e_o$. It should be noted that the signal $e_o$ represents a logical input variable or its complement, depending on the logical function attained.

The precharging circuit of the output line MEi simply comprises a PMOS field effect transistor P5, the source of which is connected to a positive supply voltage Vdd and the drain of which is connected to the line MEi. The complementary signal NPHI of the signal PHI is applied to the gate of the transistor P5.

The NMOS field effect transistors TOi ... TOj comprise a NOR gate belonging to the second matrix 2. The source of each of these transistors is connected to ground, and their drain is connected to one of the output lines Sk of the second matrix 2. The gates of these transistors respectively receive the signals MOi ... MOj originating in an associated circuit. For the sake of clarity, only the circuit P1-P4, N1-N4 associated with the transistor TOi has been shown in FIG. 2.

The precharging circuit of the output line Sk of the second matrix is attained by means of a PMOS field effect transistor P7, the source of which is connected to a positive supply voltage Vdd and the drain of which is connected to the output line S. The complementary signal NPH0 of the signal PH0 is applied to the gate of this transistor. The output line MEi of the first matrix is connected to the gate of an NMOS field effect transistor N2 and to the gate of a PMOS transistor P2, the drains of which are connected to one another. The source of the transistor P2 is connected to the drain of another PMOS transistor P1, the source of which is connected to a positive supply voltage Vdd. The gate of the transistor P1 receives the complementary signal NPH0 of the signal PH0. The source of the transistor N2 is connected to the drain of an NMOS transistor N1, the source of which is connected to ground. The gate of the transistor N1 receives the signal PH0. The unit comprising the transistors P1, P2, N2, N1 comprises a three-state inverter.

The signal MEO present at the drains of the transistors N2 and P2 is applied to the gate of another PMOS transistor P4, the source of which is connected to the drain of a PMOS transistor P3 having its source connected to a positive supply voltage Vdd. The complementary signal NPHl of the signal PH1 is applied to the gate of the transistor P3. The drain of the transistor P4 is connected to the drain of another NMOS transistor N3, the source of which is connected to ground. The phase signal PH0 is applied to the gate of the transistor N3.

The signal MOi present at the drains of the transistors N3 and P4 is applied to the gate of the associated transistor TOi. Depending on the logical functions that are to be attained by means of this logic array, the signal MOi can also be applied to the gate of another transistor that is part of another NOR gate not shown in the second matrix.

Before describing the functioning of the circuit of FIG. 2, the correspondence among the circuit elements of this figure and the elements shown in FIG. 1 should be explained.

The precharging circuit 5 of the output lines of the second matrix 2 comprises as many transistors P7 as the second matrix has outputs. Similarly, the precharging circuit 3 of the output lines of the first matrix 1 comprises as many transistors P5 as the first matrix has outputs. The forcing circuit of the input lines of the first matrix comprises as many transistors N4 as the first matrix has inputs. Similarly, the forcing circuit 6 of the input lines of the second matrix 2 comprises as many transistors N3 as this matrix has inputs.

The isolating means 8 comprise as many three-state inverters P1, p2, N2, N1 as the first matrix has output lines.

The second isolating means 9 comprise the corresponding transistors P3.

Finally, a memorization cell associated with an output line of the first matrix is attained via the structural capacity of the transistor P4.

It should be noted that the three-state inverter P1, P2, N2, N1 and the unit comprising the transistors N3, P3, P4 also have an amplification function.

In order now to describe the function of the circuit of FIG. 2, the timing diagrams shown in FIG. 3 should be consulted.

The timing diagram A shows the signals PH0 and PH1 defining the two clock phases.

The timing diagram B shows the signal eo applied to the input of the gate 10.

The timing diagram C represents the voltage Eo present at the gate of the transistor TEi0.

The timing diagram D shows the voltage present on the output line Mei of the first matrix.

The timing diagram E shows the memorized voltage MEO present at the gate of the transistor P4.

The timing diagram F shows the voltage MOi appearing at the drains of the transistors N3 and P4.

The timing diagram G, finally, shows the output signal Sk of the NOR gate of the second matrix shown in FIG. 2.

In order to explain the function of the circuit, it is assumed that the input signal eo initially has the value of logical 1, up to time t6, and then shifts to the value of logical 0. This example makes it possible to illustrate the functioning of the circuit in a particular case, which can very easily be applied more generally regardless of the number of inputs and outputs of the logic array, and regardless of the logical values assumed by the input variables.

The signals PH0 and PH1 of the timing diagram A define the two functional phases of the apparatus. According to the timing diagram A, the phases PH0 and PHI have been assumed to succeed one another directly, but the same functioning can be obtained by using two phase signals in which there is an idle time between these two phases. The only condition is that the phases PH0 and PH1 do not overlap.

Time t0 is the beginning of the first phase PH0 and the output voltage of the NAND gate 10 assumes the value of logical 0. As a result, the transistor P6 is conductive. On the other hand, since the signal PHl has the value of logical 0, the transistor N4 is blocked. As a result, the signal $E_o$ applied to the gate of the transistor TEi0 assumes the value of logical 1, thus making this transistor conductive. The signal NPH1, which is the complement of the signal PHI, also has the value of logical 1, causing the transistor P5 to be blocked. The output line MEi then discharges via the drain-to-source path of the transistor TEi0.

The signal NPH0 that is the complement of the signal PH0 has the value of logical 0, thus making the transistor P1 conductive. Similarly, the signal PH0 applied to the transistor N1 makes it conductive. As a result, the three-state inverter P1, P2, N2, N1 functions as an inverter. Thus at time t2 corresponding to the end of the discharging of the line MEi, the voltage MEO applied to the gate of the transistor P4 assumes the value of logical 1.

Moreover, the signal NPHI applied to the gate of the transistor P3 is 0, which makes this transistor blocked. Finally, the signal PH0 applied to the gate of the transistor N3 makes it conductive. As a result, no matter what the value of the voltage ME0, the voltage MOi applied to the transistor TOi becomes 0, thus making this transistor assume the blocked state. Finally, since the signal NPH0 has a zero voltage, the transistor T7 is made conductive. The output line Sk is thus precharged to the voltage Vdd. This state appears at the beginning of the time t3 shown in the timing diagram G.

After the rise of the ensuing phase PHI is completed at time t4, the output voltage of the gate 10 assumes the value of logical 1, as does the voltage applied to the gate of the transistor N4. This causes the shift of the signal $E_o$ to 0, thus blocking the transistor TEi0. Since the voltage applied to the gate of the transistor P5 is 0, this transistor is conductive. As a result, the line MEi charges to the supply voltage Vdd, which is attained at time t5 of the timing diagram D.

The transistors P1 and N1 are also blocked, which prevents any change in the voltage of the signal MEO. This relates to the desired memorization effect. Moreover, the transistor P3 is conductive and the transistor N3 is blocked. However, since the gate voltage MEO of the transistor P4 has a positive value, this transistor remains blocked, keeping the voltage of the signal MOi at the value 0. As a result, the transistor TOi remains blocked and hence does not change the output voltage Sk, which maintains the value of logical 1 if none of the other transistors TOj has discharged the output line Sk.

Upon the ensuing phase PH0, the transistors N3 and P7 become conductive beginning at time t7, and the transistor P3 is blocked, thus permitting the precharging of the line Sk.

On the other hand, the transistor P5 is blocked, which authorizes a change in the voltage of the line MEi. As it has been assumed that the new logical value assumed at time T6 by the input signal $e_o$ was 0, the result is that the transistor P6 is conductive, since the transistor N4 is blocked. It follows that the voltage $E_o$ retains the value of 0, thus keeping the transistor TEi0 in the blocked state.

If no other transistor TEin is conductive, the line MEi retains a positive voltage, which keeps the voltage MEO of the gate of the transistor P4 at 0.

Upon the ensuing phase PHI, from time t8 on, the transistors P1, N1, N3 are once again blocked, and the transistor P3 is conductive. Since the signal MEO is at 0, the transistor P4 is made conductive, which makes the signal MOi shift to the value of logical 1 at time t8. As a result, the transistor TOi is made conductive, which produces the discharge of the output line Sk at time T9.

The exemplary embodiment of the invention and its function as described above demonstrate that the object of the invention is quite adequately attained with a minimum number of additional components. Nevertheless, it is clear that the apparatus according to the invention is most suitably applicable to the case where the number of monomials (minterms or maxterms), that is, the number of output lines of the first matrix, is relatively limited.

It should be noted that at the beginning of the precharging phase of the first matrix, that is, at the beginning of phase PHI, there is the danger that the transistors P5 and TEi0 will be simultaneously conductive, thus creating a conduction situation. This conduction can easily be reduced by taking the precaution of dimensioning the transistors N4 and P5 such that the transistor N4 has a shorter switching time than that of the transistor P5. For the same reason, it is suitable to dimension the transistors N3 and P7 in such a way that the transistor N3 is faster than the transistor P7.

What is claimed is:

1. A logic array comprising a first matrix (1) of logical gates having output signals (ME) which are transmitted to inputs (MO) of a second matrix (2) comprising one or more logical gates, each logical gate of said matrices (1, 2) having an input line and an output line and being of the dynamic type, operating during a functional phase preceded by a precharging phase, said precharging phase serving to charge the output lines (MEi, S) of said logical gates to a predetermined voltage (Vdd) by precharging means (3, 4, 5, 6) that are made active by a precharging control signal, said array including memorizing means (7) having inputs which are connected to the output lines of the gates of the first matrix (I) by way of first controlled isolating means (8), and having outputs (MEO) connected to the input lines of the gates of the second matrix (2) by way of second controlled isolating means (9), said first controlled isolating means (8) being controlled for authorizing the transfer of the signals emitted by the first matrix (1) to said memorizing means (7) during the precharging phase (PHO) of the second matrix (2), and said second controlled isolating means (9) being controlled for authorizing the transfer of the data contained in said memorizing means (7) to the second matrix (2) during the precharging phase (PHI) of the first matrix (1).

2. A logic array as defined by claim 1, wherein the first and second matrices comprise NOR gates formed of NMOS field effect transistors (TEiO, TEin, TOi, Toj) and said means for precharging these NOR gates include means (P5, P7) for applying a positive voltage to their outputs (MEi, Sk) and means (N4, N3) for applying a zero voltage to their inputs.

3. A logic array as defined by claim 2, wherein said isolating means (8, 9) include means (P2, N2, P3, P4) for amplifying signals input thereto.

4. A logic array as defined by claim 3, wherein said precharging means (3, 4, 5, 6) includes, a for each output line of said matrices, one precharging transistor of the PMOS field effect type (P5, P7) having a source electrode connected to a positive voltage (Vdd), and a drain electrode connected to an associated output line, the transistors of the first matrix and the second matrix (1, 2) being respectively made conductive during the precharging phase of the first and second matrix, respectively.

5. A logic array as defined by claim 4, wherein said precharging means (3, 4, 5, 6) includes, for each input line of said matrices, an inhibition transistor of the NMOS field effect transistor type (N4, N3) having another source electrode connected to the ground and another drain electrode connected to an associated input line, the transistor of the first matrix and the second matrix (1, 2) being respectively made conductive during the precharging phase of the first and second matrix, respectively.

6. A logic array as defined by claim 5, wherein the precharging phase of one matrix is controlled by a clock signal having first and second successive positive phases (PH0, PH1), said first and second phases of said clock signal being applied respectively to gates of the inhibition transistors of the first and second matrices, and complementary signals (NPH0, NPH1) of said first and second phases (PH0, PH1) being applied respectively to gates of the precharging transistors of said second and first matrices.

7. A logic array as defined by claim 6, wherein said first and second isolating means (8, 9) and said memorizing means (7) are a single circuit comprising a three-state inverter (P1, P2, N1, N2) made active by the first clock phase (FH0), an output (ME0) of the circuit being connected to a gate electrode of a first PMOS field effect transistor (P4) having a source electrode connected to a drain electrode of a second PMOS field effect transistor (P3), a source electrode of which is connected to said positive voltage (Vdd), a drain electrode of said first transistor (P4) being connected to said input line (MOi) of the second matrix (2), a gate electrode of said second transistor (P3) receiving the complementary signal (NFH1) of the second clock phase (PH1), and memorization of said circuit being obtained via the structural capacity of said first transistor (P4).

8. A logic array as defined by claim 7, wherein each input line ($E_o$) of the first matrix (1) is connected to a drain electrode of a PMOS field effect transistor (F6) which has a source electrode connected to said positive voltage (Vdd) and has a gate electrode connected to the output of a NAND circuit (10), one input of which NAND circuit receives the first clock phase (PH0) and another input of which receives an input signal (20) associated with said input line (E0).

9. A logic array as defined by claim 5, wherein said inhibition transistors (N4, N3) of the matrices are dimensioned such that they are faster than said precharging transistors (P5, P7) of said matrices.

10. A logic array as defined by claim 6, wherein said inhibition transistors (N4, N3) of the matrices are dimensioned such that they are faster than said precharging transistors (P5, P7) of said matrices.

11. A logic array as defined by claim 7, wherein said inhibition transistors (N4, N3) of the matrices are dimensioned such that they are faster than said precharging transistor (P5, P7) of said matrices.

12. A logic array as defined by claim 8, wherein said inhibition transistors(n4, M3) of the matrices are dimensioned such that they are faster than said precharging transistors (P5, P7) of said matrices.

* * * * *

UNITED STATES PATENT AND TRADEMARK OFFICE
CERTIFICATE OF CORRECTION

PATENT NO. : 4,812,685

DATED : March 14, 1989

INVENTOR(S) : ANCEAU

It is certified that error appears in the above-identified patent and that said Letters Patent is hereby corrected as shown below:

Col. 8, claim 1, line 37, "matrix (I)" should be --matrix (1)--.

Col. 8, claim 1, line 47, "(PHI)" should be --(PH1)--.

Col. 8, claim 4, line 2, after "includes," delete --a--.

Col. 9, claim 5, line 4, "transistor" should be --transistors--.

Col. 9, claim 6, line 17, "NPHI" should be --NPH1--.

Col. 9, claim 7, line 25, "FHO" should be --PHO--.

Col. 10, claim 7, line 3, "NFH1" should be --NPH1--.

Col. 10, claim 12, line 28, "n4,M3" should be --N4,N3--.

Signed and Sealed this

Twenty-fourth Day of April, 1990

Attest:

HARRY F. MANBECK, JR.

*Attesting Officer*     *Commissioner of Patents and Trademarks*